United States Patent
Thakoor et al.

[11] Patent Number: 6,108,111
[45] Date of Patent: Aug. 22, 2000

[54] FERROELECTRIC OPTICAL COMPUTING DEVICE WITH LOW OPTICAL POWER NON-DESTRUCTIVE READ-OUT

[75] Inventors: Sarita Thakoor; Anilkumar P. Thakoor, both of Covina, Calif.

[73] Assignee: California Institute of Technology, Pasadena, Calif.

[21] Appl. No.: 08/795,954

[22] Filed: Feb. 6, 1997

Related U.S. Application Data

[62] Division of application No. 08/228,730, Apr. 18, 1994, Pat. No. 5,621,559.

[51] Int. Cl.[7] .............................. G11C 11/22; H01G 7/06
[52] U.S. Cl. ................................................ 359/107
[58] Field of Search .................... 359/107, 108, 359/323, 322, 251, 252, 254

[56] References Cited

U.S. PATENT DOCUMENTS

| | | | |
|---|---|---|---|
| 3,586,415 | 6/1971 | Kumada et al. | 359/251 |
| 3,701,122 | 10/1972 | Geusic et al. | 359/107 |
| 3,823,998 | 7/1974 | Yazaki et al. | 359/251 |
| 3,990,770 | 11/1976 | Carl et al. | 365/121 |
| 4,160,927 | 7/1979 | Brody | 310/302 |
| 4,524,294 | 6/1985 | Brody | 310/311 |
| 4,621,903 | 11/1986 | Murano et al. | 359/323 |
| 4,636,786 | 1/1987 | Haertling | 359/323 |
| 4,793,697 | 12/1988 | Wu et al. | 359/323 |
| 5,185,752 | 2/1993 | Welch et al. | 372/22 |
| 5,317,666 | 5/1994 | Agostinelli et al. | 385/122 |

*Primary Examiner*—Jon W. Henry
*Attorney, Agent, or Firm*—Michaelson & Wallace

[57] ABSTRACT

Photoresponse from a ferroelectric optical computing device, such as a memory cell or a logic switch, is increased by either illuminating the regions of the ferroelectric crystal under the electrode edges in a sandwich structure device or by aligning the principal axis of the ferroelectric crystal parallel to the linear polarization vector of the optical beam. Device density is increased by reducing the beam size using a small near-field optical fiber. Device evaluation including imprint failure susceptibility is performed by illuminating each ferroelectric optical computing device in a large array of such devices and storing the device address of any device whose response departs from a normal range.

12 Claims, 8 Drawing Sheets

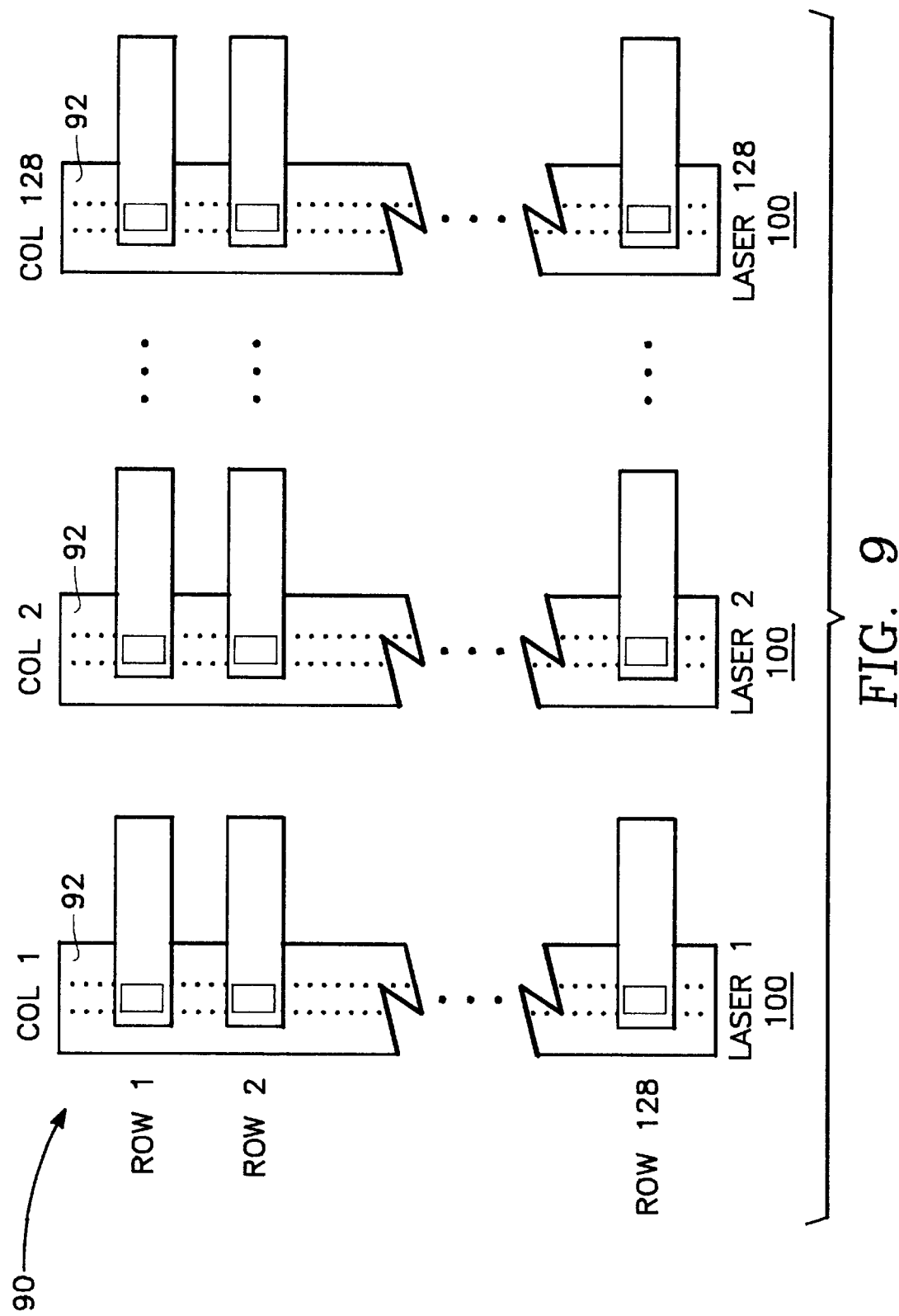

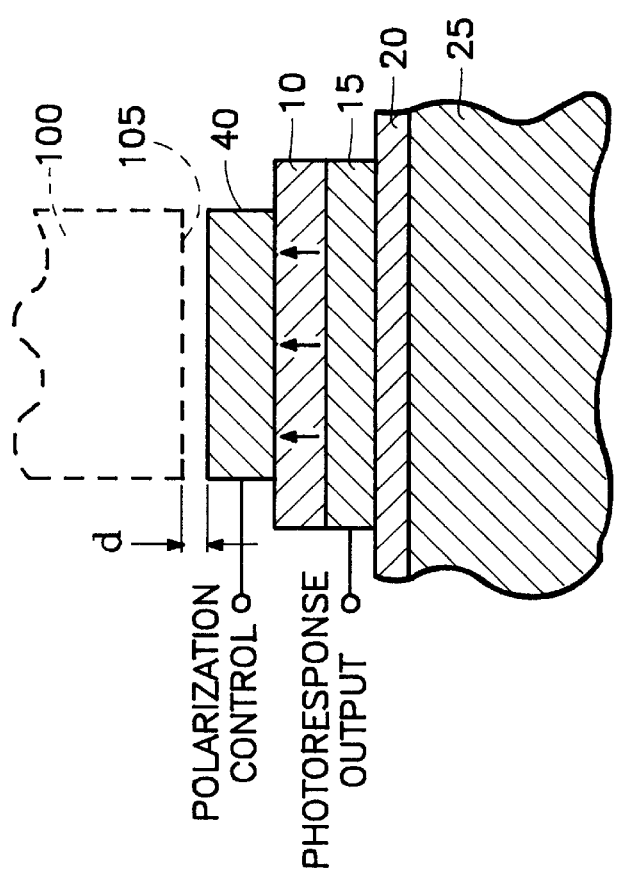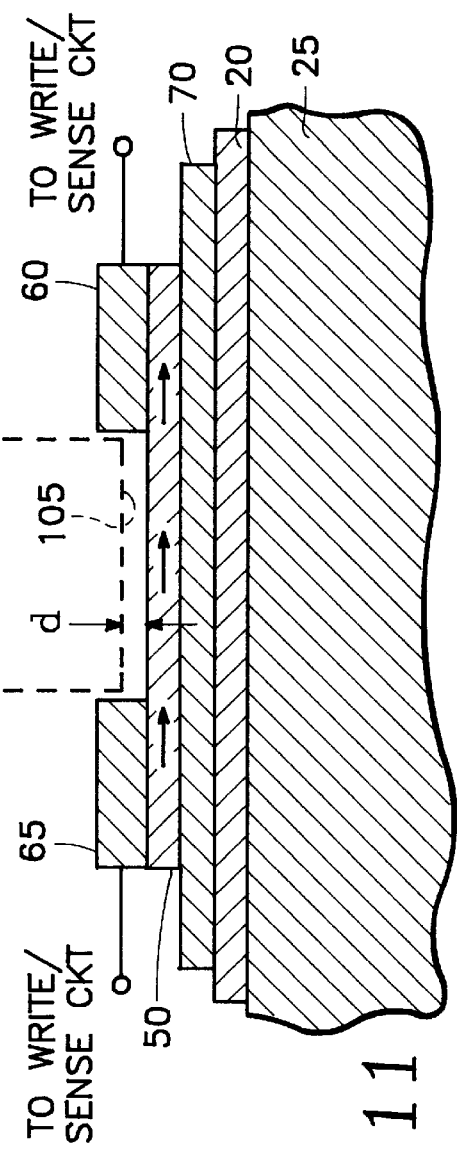

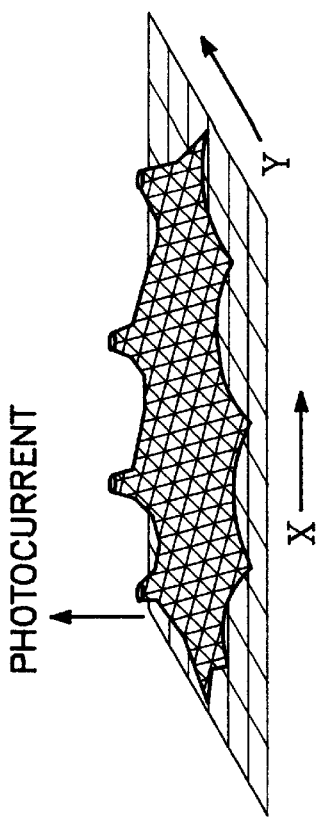
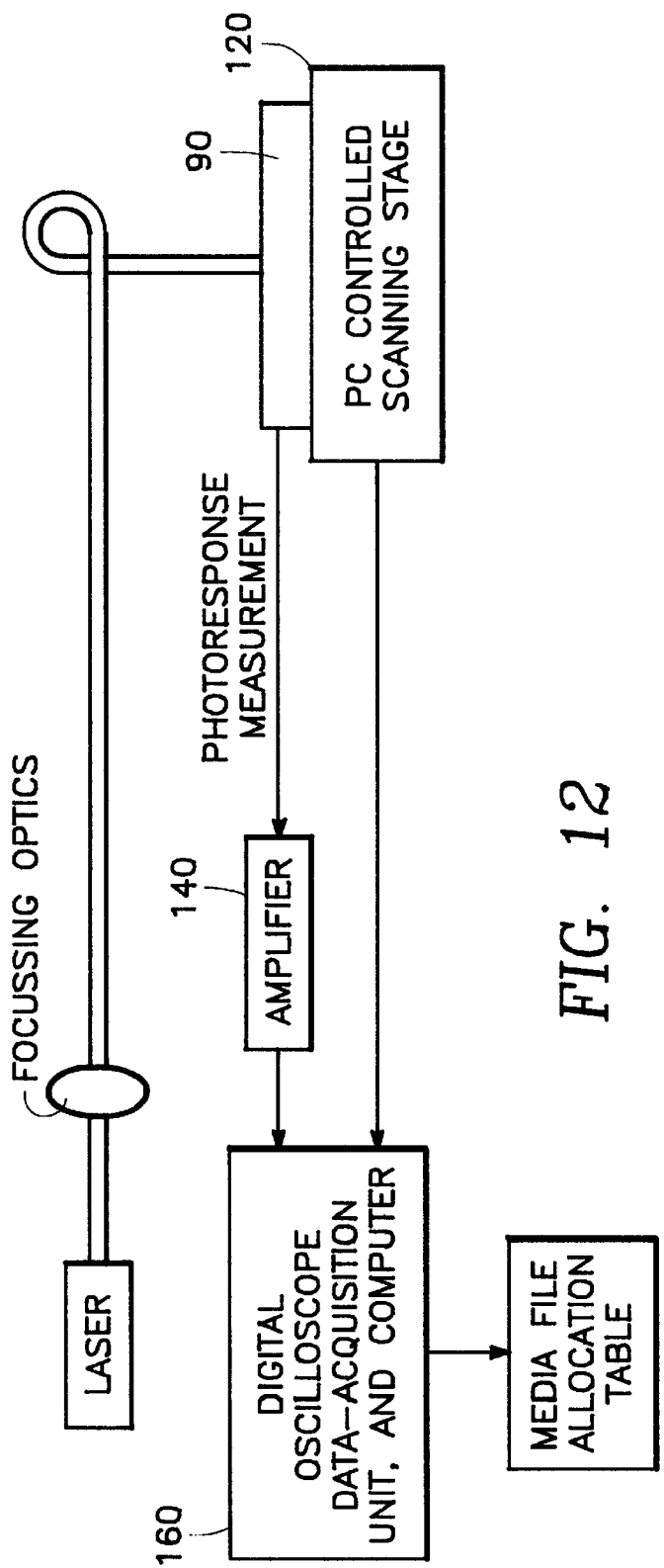
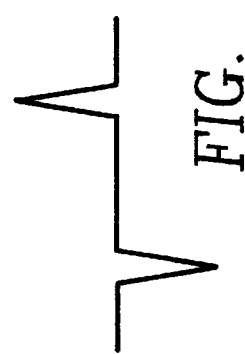
FIG. 12
FIG. 13
FIG. 14

FERROELECTRIC OPTICAL COMPUTING DEVICE WITH LOW OPTICAL POWER NON-DESTRUCTIVE READ-OUT

This is a division, of application Ser. No. 08/228,730, filed Apr. 18, 1994 now U.S. Pat. No. 5,621,559.

BACKGROUND OF THE INVENTION

1. Technical Field

The invention is related to ferroelectric optical computing devices, including such optical computing devices as (a) memory cells and (b) logic switches, and in particular to reading out and evaluating such devices non-destructively at very low optical power levels.

2. Background Art

An optical computing device can be made of a ferroelectric material such as a lead zirconate titanate (hereinafter, "PZT") thin film. As employed in this specification, the term "optical computing device" includes memory cells as well as logic switches. The class of [1]"ferroelectric" belongs to a group of materials which are non-centro symmetric crystals, of which PZT is one example. Such materials exhibit two stable opposite electrically polarized states, in which the ferroelectric crystal has an electrical polarization field along a principal or "C" axis of the crystal, the polarities of the two states being opposite. In the case of a PZT ferroelectric crystal, the polarization arises from the displacement of a zirconium or titanium atom in the center of each crystal unit along the crystalline C-axis in either one of two possible directions to either one of two stable locations. The crystal is put into one of these two states by applying along the crystalline C-axis a large external electric field whose polarity is in the direction of the desired crystal state. This may be done by either applying a D.C. electric field across a pair of electrodes displaced along the crystalline C-axis or by illuminating the crystal with light polarized along the crystalline C-axis in the desired direction with a wavelength corresponding to an energy equal to or exceeding the band gap energy of the crystal. One such device disclosed by Thakoor, "High speed, nondestructive readout from thin-film ferroelectric memory," *Applied Physics Letters*, Volume 60, Number 26, pages 3319–3321 (Jun. 29, 1992), is illustrated in FIG. 1 of the present specification. A ferroelectric crystal thin film layer 10 having a thickness between 0.15 and 0.3 microns is sandwiched between a bottom platinum electrode 15 lying on a silicon dioxide passivation layer 20 of a silicon substrate 25 and a top platinum electrode 30. At least nearly all of the crystal units within the thin film layer 10 have their C-axes oriented in the same direction, this direction being perpendicular to the plane of the thin film crystalline layer 10, as indicated by the arrows inside the layer 10 in FIG. 1. With this perpendicular orientation of the crystalline C-axis, the polarization of the crystal layer 10 may be set by applying a voltage of the desired polarity across the two electrodes 15, 30.

The polarized state of the optical computing device of FIG. 1 is sensed or "read-out" by applying to the top side of the device linearly polarized radiation 35 of sufficient power density and a suitable wavelength corresponding to a photon energy below the band gap energy of the ferroelectric crystalline thin film layer 10. If the thin film layer 10 is a PZT crystal, then the power density of the linearly polarized radiation 35 is about 20 milliWatts per square micron and the wavelength is about 532 nanometers, which is. available from convention laser sources. For a pulsed laser source, the electrical (current) response across the electrodes 15, 30 is characterized by the waveform of FIG. 2A if the thin film layer 10 is in one of its two polarized states and by the waveform of FIG. 2B in the other polarized state. Comparing the waveforms of FIGS. 2A and 2B, the responses of the two polarized crystalline states are electrical currents of opposite polarities. Thus, the optical computing device of FIG. 1 can switch between binary logic states to serve as a computer logic switching device, and can store and read-out such logic states in non-volatile fashion to serve as a non-volatile computer memory. Typically, the radiation 35 is a laser beam having a beam diameter less than the width of the top electrode 30 so that the entire beam 35 is incident on and confined to the top electrode 30.

One limitation of such devices is that the required power to "read-out" the polarization state stored in the crystalline thin film layer is relatively high (e.g., 20 milliWatts per square micron for PZT material). This limitation is problematic because it imposes a relatively high power consumption level in such devices and poses a heat dissipation problem in integrated circuits constituting large arrays of such devices.

Another limitation of said devices is that they tend to be susceptible to "imprint" failures. An imprint failure occurs whenever a device cannot be changed from its initial polarization state, or, if it is changed, tends to drift from the new polarization state back to the initial polarization state. This can occur whenever the device is left in a particular polarization state for a relatively long period of time (e.g., months), or temperature cycling of the device. It is thought that imprint failure arises from charge mobile defects that accumulate preferentially in one direction with extended time/temperature/voltage cycling. So, under the influence of the internal field of these defects, the switching of the polarization state of the ferroelectric film by an applied external voltage is inhibited, impeded and unstable.

Another problem of such devices is fatigue, which is a reduction in the polarizability of such devices as a result of voltage cycling. Fatigue and imprint failure are problems that are common to all ferroelectric based optical computing devices, including memories as well as logic switches. Fatigue is thought to occur because of accumulation of mobile defects and free space charge that give rise to local fields which screen the applied external field, thereby reducing polarizability of the ferroelectric thin film.

SUMMARY OF THE DISCLOSURE

The invention is embodied in an optical computing device responsive to an optical beam, including a bottom electrode having a planar surface, a ferroelectric crystalline thin film layer overlying the planar surface of the bottom electrode, the ferroelectric crystalline thin film layer having two stable polarization states and a principal crystalline axis and being responsive to an electric field having a component along the principal axis by transitioning between the polarization states, the principal axis being generally non-parallel to the planar surface of the bottom electrode, and a top electrode facing a direction of arrival of the optical beam and having a planar surface generally parallel to the bottom electrode overlying the ferroelectric crystalline thin film layer and having a width not exceeding the beam diameter of the optical beam, whereby a region of the ferroelectric crystalline thin film layer underlying a peripheral edge of the top electrode is illuminated by the optical beam. The optical beam preferably has a wavelength corresponding to a photon energy less than a band gap energy of the ferroelectric crystalline thin film layer and a very low power density (e.g., on the order of only 2 milliWatts per square micron for PZT crystals).

The invention is also embodied in an optical computing device including a ferroelectric crystalline thin film layer having a top surface facing a direction of incidence of the optical beam and having two stable polarization states and a principal crystalline axis and being responsive to an electric field having a component along the principal axis by transitioning between the polarization states, the principal axis being generally parallel to the top surface, the ferroelectric crystalline thin film layer being responsive to the optical beam by exhibiting a current flow between the electrodes having a direction indicative of one of the two polarization states, and a pair of top electrodes on the top surface facing a direction of arrival of the optical beam and being displaced from one another by a beam aperture region of the crystalline layer. The optical beam is linearly polarized in a direction parallel to the planar surface of the bottom electrode and the principal crystalline axis for maximum photoresponse.

In accordance with a further aspect of the invention, an optical fiber guides the optical beam to the device and has an output end thereof facing the device and displaced therefrom by a sufficiently short distance to suppress diffraction in accordance with a near-field optical effect. Preferably, the output end of the optical fiber has a width on the order of 10–100 nanometers, so that the device can be extremely small.

The invention is further embodied by a method of evaluating a ferroelectric optical computing device, including the steps of illuminating the optical computing device with a beam of light of a wavelength corresponding to a photon energy less than a band gap energy of the ferroelectric optical computing device so as to obtain a photoresponsive electrical output from the device and comparing the electrical output with a threshold level. Preferably, the illuminating step includes guiding the beam through an optical fiber having an output end sufficiently near the device to provide a near-field optical coupling from the optical fiber. The optical device may be included in an array of virtually identical optical devices, the illuminating step is carried out at each one of the devices in the array, and the threshold level corresponds to a deviation from an average response level of many of the devices in the array. The method may further include storing an address location of any device having a photoresponse deviating beyond the threshold in a file allocation table of the array.

BRIEF DESCRIPTION OF THE DRAWINGS

FIG. 9 is a schematic diagram illustrating a memory architecture in accordance with one aspect of the invention.

FIG. 10 is a diagram of one embodiment of a high-density optical computing device embodying the invention.

FIG. 11 is a diagram of another embodiment of a high-density optical computing device embodying the invention.

FIG. 12 is a diagram illustrating one method of carrying out the non-invasive defect evaluation in accordance with a further aspect of the invention.

FIG. 13 is a diagram of a response waveform obtained in one aspect of the evaluation method of FIG. 12.

FIG. 14 is a diagram of a response waveform obtained in another aspect of the evaluation method of FIG. 12.

DETAILED DESCRIPTION OF THE PREFERRED EMBODIMENTS

Figure 1:
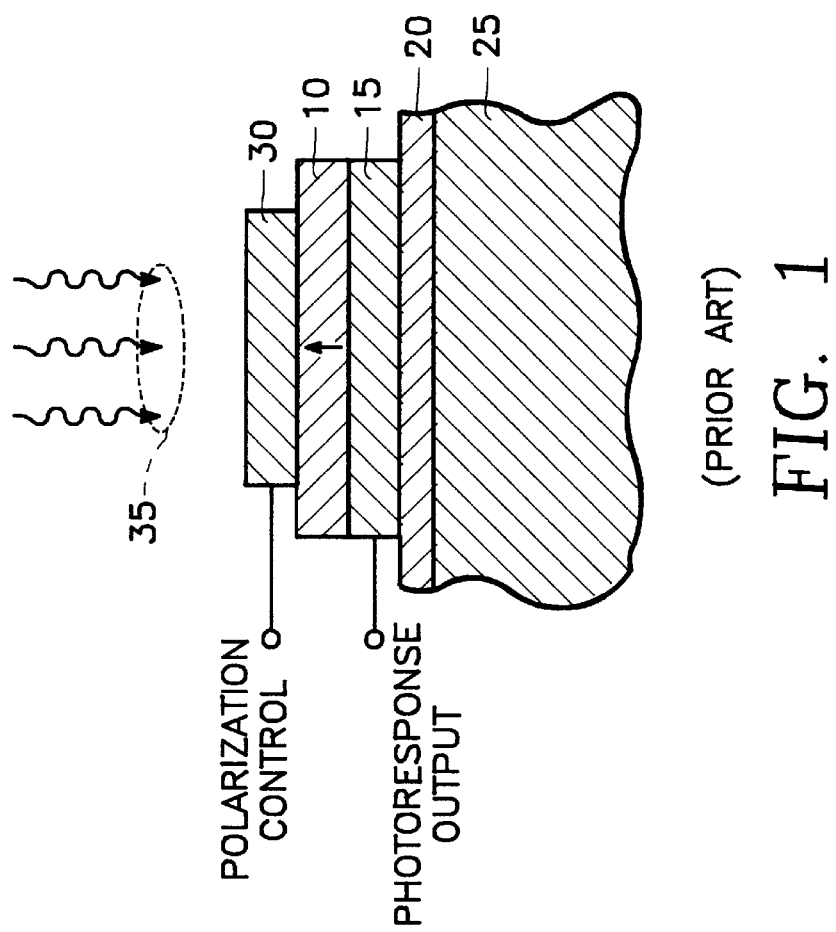
FIG. 1 is a diagram of a ferroelectric optical computing device of the prior art.
Figure 3:
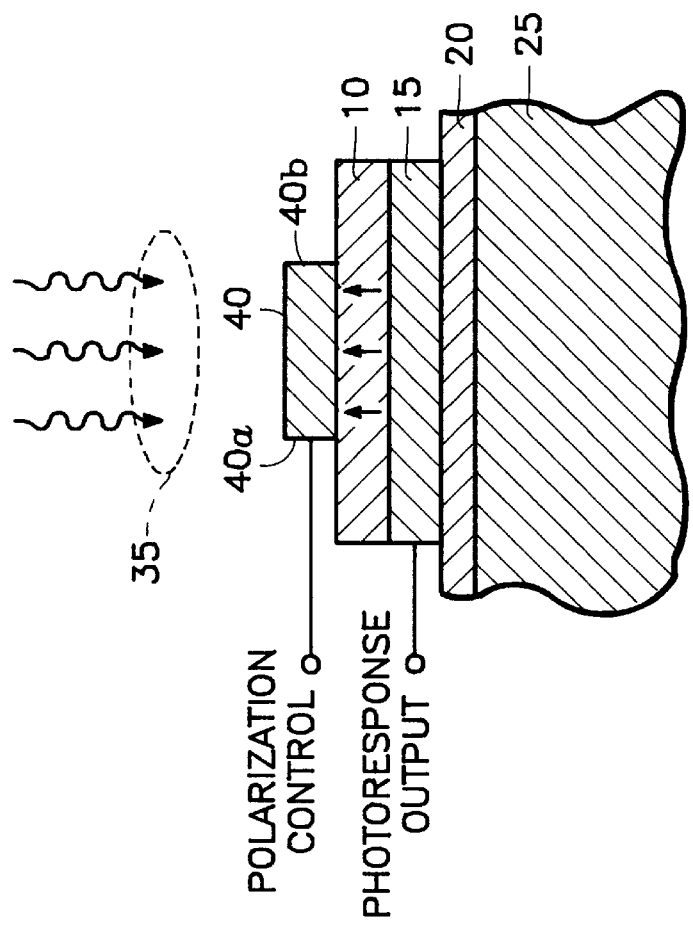
FIG. 3 is a diagram of a ferroelectric optical computing device in accordance with a first embodiment of the invention.

Referring to FIG. 3, the top electrode 30 of FIG. 1 is replaced by a smaller top electrode 40 which is a platinum dot of between 100 and 250 microns in diameter, which is smaller than the diameter of the laser beam 35. As in FIG. 1 non-destructive read-out is achieved using a laser beam wavelength of 532 nanometers. It is a discovery of the present invention that the laser power density at the electrode 40 may be reduced by an order of magnitude from 20 to 2 milliWatts per square micron. At this power level, a bipolar phenomenon is generated across the electrodes 15, 40 illustrated in FIGS. 4A and 4B, characterized by a sharp positive current spike in response to a laser pulse beam 35 if the crystalline thin film layer 10 is in a particular one of its two possible polarization states (FIG. 4A) and by a sharp negative spike if the layer 10 is in its other polarization state. As a result, the polarization state of the layer 10 can be unambiguously read-out with an order of magnitude reduction in the required radiation power, a significant advance in the art.

Figure 4A:
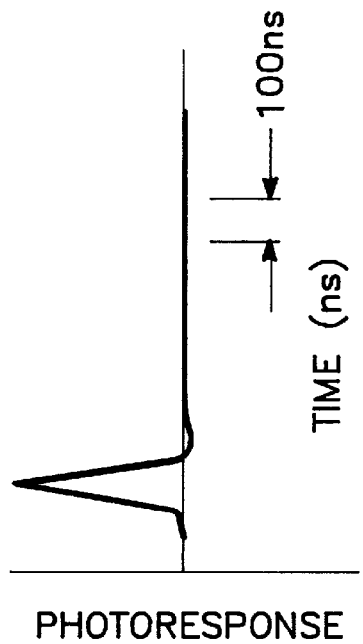
FIGS. 4A and 4B illustrate waveforms of optically induced electrical responses of the device of FIG. 3 in two respective polarization states thereof.
Figure 4B:
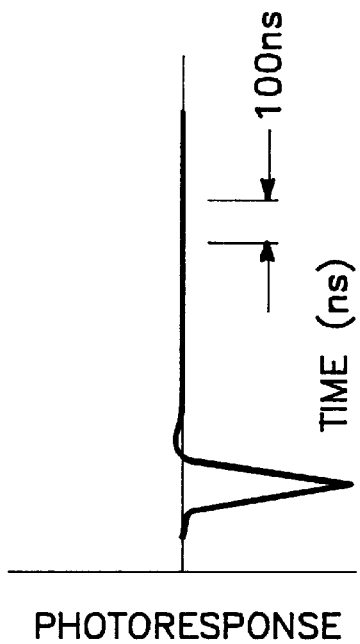
Figure 5:
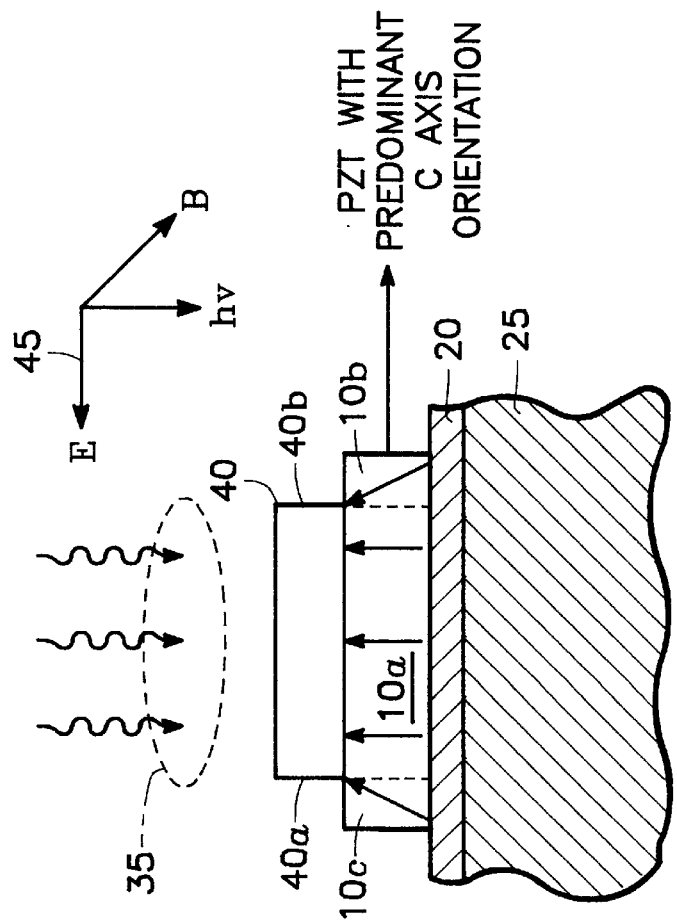
FIG. 5 is a diagram corresponding to FIG. 3 illustrating in detail the crystalline C-axes orientations across the device.

A further discovery of the invention is that the response is increased by moving the beam 35 to an edge 40a or 40b of the top electrode 40. This would seem to indicate that the unipolar response of FIGS. 4A and 4B arises exclusively from optical interactions in the regions of the thin film layer 10 directly underlying the top electrode edges 40a, 40b. Again without subscribing to any particular theory, one possible explanation for such a phenomenon is illustrated in FIG. 5, showing that the region 10a of the thin film layer 10 directly underlying the top electrode 40 have their C-axes correctly aligned perpendicular to the plane of the sandwich structure, while the regions 10b, 10c near the edges of the top electrode the C-axes deviate from the perpendicular. As a result, in PZT films for example, only the peripheral regions 10b, 10c having any coupling of the optical polarization vector 45 of the linearly polarized beam 35 and the motion of the Zirconium or Titanium atom along the crystal C-axis.

It is felt that for PZT material, the polarization force exerted on the Zirconium or Titanium atom to displace it along the crystal C-axis is proportional to the cosine of the angle between the C-axis and the electric field polarization vector of the optical beam. Thus, a key element in reducing the beam power density by an order of magnitude is illumination of the crystalline edge regions 10a, 10b. This is achieved by the small size of the top electrode 40 relative to the diameter of the beam 35.

It is felt that the order of magnitude increase in photoresponse of the device depends upon the "d.c. effect". This effect arises from the interaction between the optical E-field of the beam and the ferroelectric crystal E-field and is known to occur in bulk single crystals. The observed photoresponse magnitude is proportional to the power and optical polarization of the incident beam and the electric polarization state of the ferroelectric crystal. Indeed, as pointed out above, the magnitude is proportional to the cosine of the angle between the E-field vector of the crystal and the E-field vector of the incident beam. The observed photoresponse polarity is determined by the electric polarization state of the ferroelectric crystal.

Figure 6:
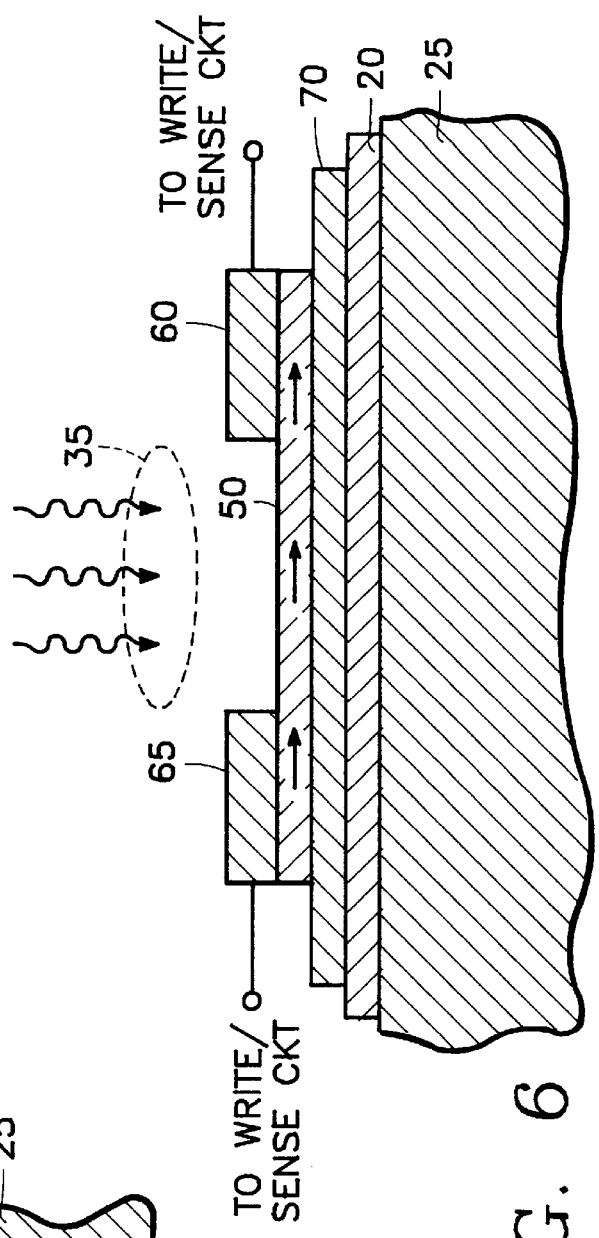
FIG. 6 is a diagram of a ferroelectric optical computing device in accordance with the preferred embodiment of the invention.

This discovery leads to the preferred embodiment of the invention illustrated in FIG. 6, in which the ferroelectric thin film layer 10 with a perpendicular C-axis orientation is replaced by a ferroelectric thin film layer 50 with a parallel orientation, in which all of the crystalline C-axes are parallel with the plane of the thin film layer 10. The advantage is that the C-axes are now parallel with the optical polarization vector 45 of the linearly polarized beam 35 for maximum coupling along the C-axis. The sandwich electrodes 15, 40 of FIG. 3 are replaced by co-planar electrodes 60, 65. An insulating template layer 70 may be placed between the ferroelectric layer 50 and the passivation layer 20. Writing to the device (i.e., setting the ferroelectric polarization state of the layer 50) is accomplished in one embodiment by applying a large voltage across the co-planar electrodes 60, 65 in the desired direction. The optical polarization vector of the beam 35 is parallel to the axis subtended between the two co-planar electrodes 60, 65. Thus, in one polarization state there is maximum coupling with the incoming light beam 35 for current generation in one direction while in the other there is maximum coupling for current generation in the opposite direction. As a result, the same bipolar response illustrated in FIGS. 4A and 4B is achieved by the ferroelectric optical computing device of FIG. 6. The same low beam power density (2.0 milliWatts per square micron) of FIG. 3 is employed to read out the device of FIG. 6 to achieve the bipolar response.

Figure 8:
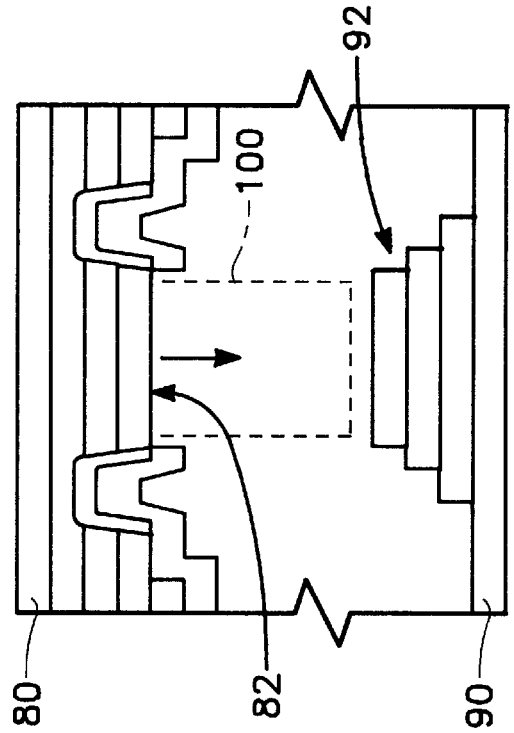
FIG. 8 is a cross-sectional view of one cell of the integrated circuit of FIG. 7.
Figure 7:
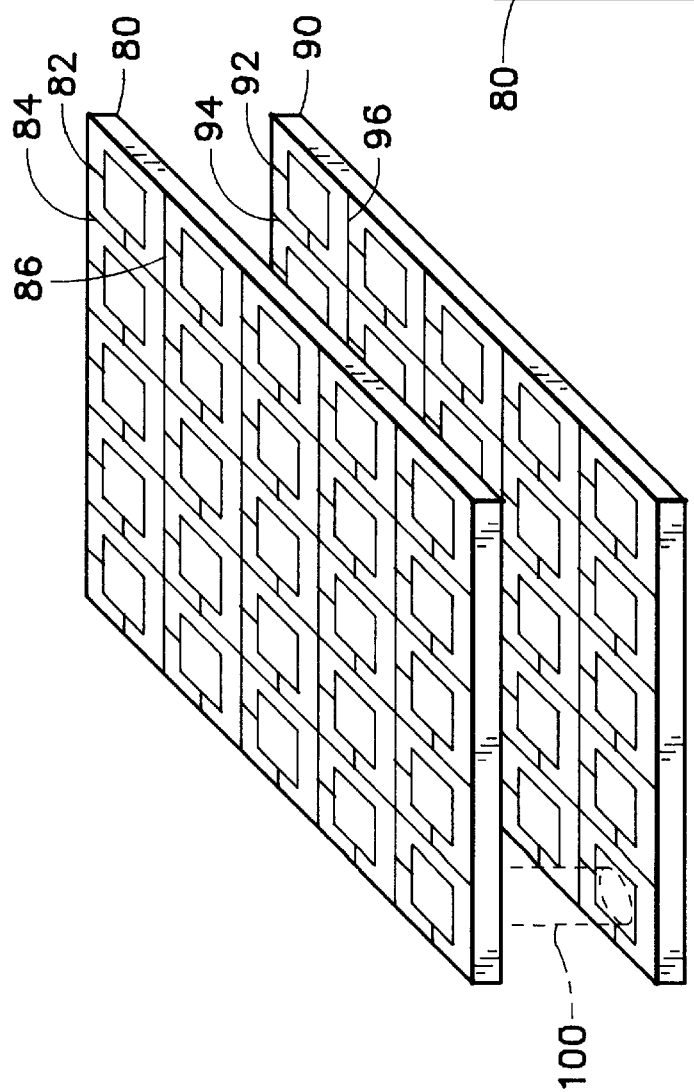
FIG. 7 is a perspective exploded view of a hybrid integrated circuit embodying the invention.

FIG. 7 illustrates how a large semiconductor laser array chip 80 consisting of rows and columns of individual semiconductor lasers 82 with row address lines 84 and column address lines 86 powering individual lasers 82 and a large semiconductor chip 90 consisting of an array of ferroelectric optical computing devices 92 of the type illustrated in FIGS. 3 or 5 each with a row address line 94 connected to one of the two electrodes (40 or 60 of FIGS. 3 or 5) and a column address line 96 connected to the other electrode (15 or 65 of FIGS. 3 or 5). The two array chips 80, 90 are sandwiched together to form a VLSI optical computing integrated circuit. FIG. 8 illustrates the combined structure of FIG. 7 at one cell consisting of an overlying laser cell 82 and an underlying ferroelectric device 92. FIG. 9 illustrates another implementation in which each column of ferroelectric devices 92 in the array 90 is illuminated simultaneously by a single column laser 100 for simultaneous or parallel read-out in an optical computer memory.

Such optical computing devices may be written for non-volatile storage and read out using purely optical processes. For this purpose, the writing is carried out by setting the polarization state of each individual ferroelectric device by applying a linearly polarized light beam having a wavelength providing a photon energy in excess of the band gap energy of the ferroelectric material. The polarization vector of the light beam is parallel to the C-axis of the ferroelectric material and lies in one of two possible directions, depending upon the polarization state to be written, as indicated in FIG. 4. Then, the polarization state of the device would be read out non-destructively by applying a light beam with a known polarization direction along the C-axis and observing the response current across the two electrodes 60, 65. For PZT materials, the preferred wavelength for the write beam is 365 nanometers while the preferred wavelength for the read beam is 532 nanometers to exploit the low-power "d.c.-effect" phenomenon discussed above.

Alternatively, such devices may be written for nonvolatile storage electrical processes. For this purpose, the writing is carried out by applying a voltage across the co-planar electrodes 60, 65 with the desired polarity at a sufficiently high voltage for a sufficient length of time. While voltage (electric field) and pulse duration required for the ferroelectric layer 10 of PZT will depend upon the exact dimensions of the device (length, width, thickness and so forth), typical values may range from 10 MV/m to 40 MV/m for the applied electric field and loons to looms for the pulse duration. The thickness for PZT crystals is typically between 1500 and 2000 Angstroms. Also, the optical and electrical methods for writing at particular polarization states are to be performed together simultaneously on the same device.

The density of the integrated circuit of FIG. 7 may be significantly increased in accordance with another embodiment of the invention by restricting the size of the beam 35 through a very thin optical fiber whose output end surface 105 is held to within a sufficiently small distance d from the ferroelectric device to benefit from near-field illumination in which spatial resolution is not limited by diffraction. FIG. 10 illustrates the structure of such a high-density near-field device implemented with the sandwich structure of FIG. 3. FIG. 11 illustrates how the high-density near-field device implemented with the parallel co-planar device of FIG. 5. In either case, the diameter of the fiber optic end surface 105 is on the order of 10–100 nm while the near-field distance d is on the order of 10–50 nm. The advantage is that the size of each ferroelectric device is greatly reduced, permitting many more such devices to be formed on a substrate of a given size.

The beam 35 may be precisely located for maximum response by scanning the beam (or moving the optical fiber 100) relative to the center of the ferroelectric device, and noting the position at which maximum device current for a given polarization state is observed.

In incorporating the high density near-field embodiment of FIGS. 10 or 11 into the integrated circuit structure of FIG. 7, an additional fiber optic layer 110 (dashed line) is interposed in the interface between the laser layer 80 and the ferroelectric device layer 90. As shown in FIG. 8, the fiber optic layer 110 provides an optical fiber 100 (dashed line in FIG. 8) between each laser cell 82 and each ferroelectric device 92.

An alternative way of accomplishing the foregoing is to simply address each ferroelectric cell 92 individually using the laser array 80, and note the individual responses of all ferroelectric devices. The X-Y address of those devices exhibiting responses 10% above the average (for state-of-the-art readout electronics) are recorded in the file allocation table.

In order to solve the problem of imprint failure in ferroelectric devices, particularly of the type illustrated in FIGS. 1 or 3, a very narrow beam (for example, of the type obtained with the near-field optical fiber of FIG. 10) is scanned across all of the devices in an array 90. Those devices having the greater tendency to exhibit imprint failure will exhibit a greater response to the beam. This is because such failure-prone devices will have more defects with principal axes aligned out of the desired perpendicular direction, and therefore will respond more strongly to incident linearly polarized light. By storing in a file allocation table of the integrated circuit the addresses of those devices whose responses deviated from the average by a predetermined threshold, the use of imprint failure-prone devices will be prevented.

One method of accomplishing the foregoing is illustrated in FIG. 12, in which an optical fiber 120 having the near-field structural characteristics discussed above relative to FIG. 10 is scanned across the integrated circuit array 90 of ferroelectric devices (see FIG. 7), using a computer-controlled X-Y scanning stage 140. The row and column electrode address lines 94, 96 are connected to an amplifier 150 which senses therefrom the photoresponse of each individual ferroelectric device 92 in the array 90. A computer or digital oscilloscope 160 constructs from the output of the amplifier a histogram or map of the responses across the array surface, the map being illustrated in FIG. 13. The X-Y location or address of any ferroelectric device 92 in the array 90 having a photoresponse deviating from the average by a predetermined amount (e.g., 10% using current state-of-the-art readout electronics) is permanently recorded in a file allocation table stored on the integrated circuit. This enables the user to avoid any ferroelectric device having known tendencies toward imprint failure.

One way of rejuvenating devices exhibiting poor performance is to illuminate them with a burst of light at 355–365 nm at a power density of 100 milliWatts per square centimeter for a pulse duration in a range of 2–12 seconds. A beam diameter of 250–500 microns, but preferably 300 microns is employed. This can be achieved using a high speed laser with 10 ns pulses, repetitively pulsing $10^4$–$10^6$ pulses per second at 0.5–1.0 milliJoules per pulse. In some cases, simultaneous application of a voltage across the electrodes with an electric field of about 40 MV/m to 50 MV/m is required to obtain rejuvenation of the fatigued sample. It is thought that illumination by bandgap light (light with a photon energy at least equal to the band gap energy of the crystal) allows generation of free carriers that recombine with the free space charge and mobile defects created due to fatigue, thus eliminating the inhibiting or impeding local fields and thereby facilitating recovery of the ferroelectric optical computing device.

Figure 2A:
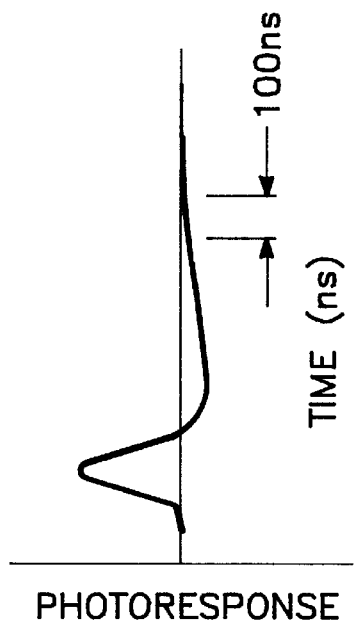
FIGS. 2A and 2B illustrate waveforms of optically induced electrical responses of the device of FIG. 1 in two respective polarization states thereof.
Figure 2B:
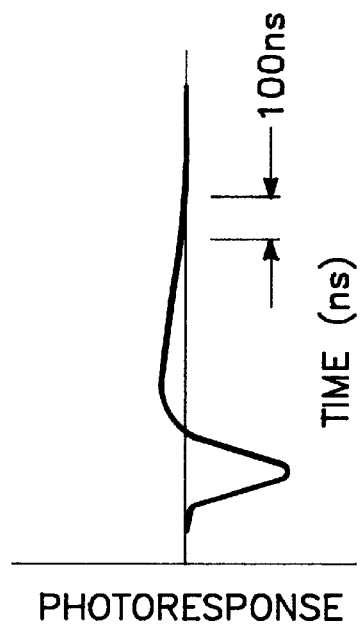
Figure 15:
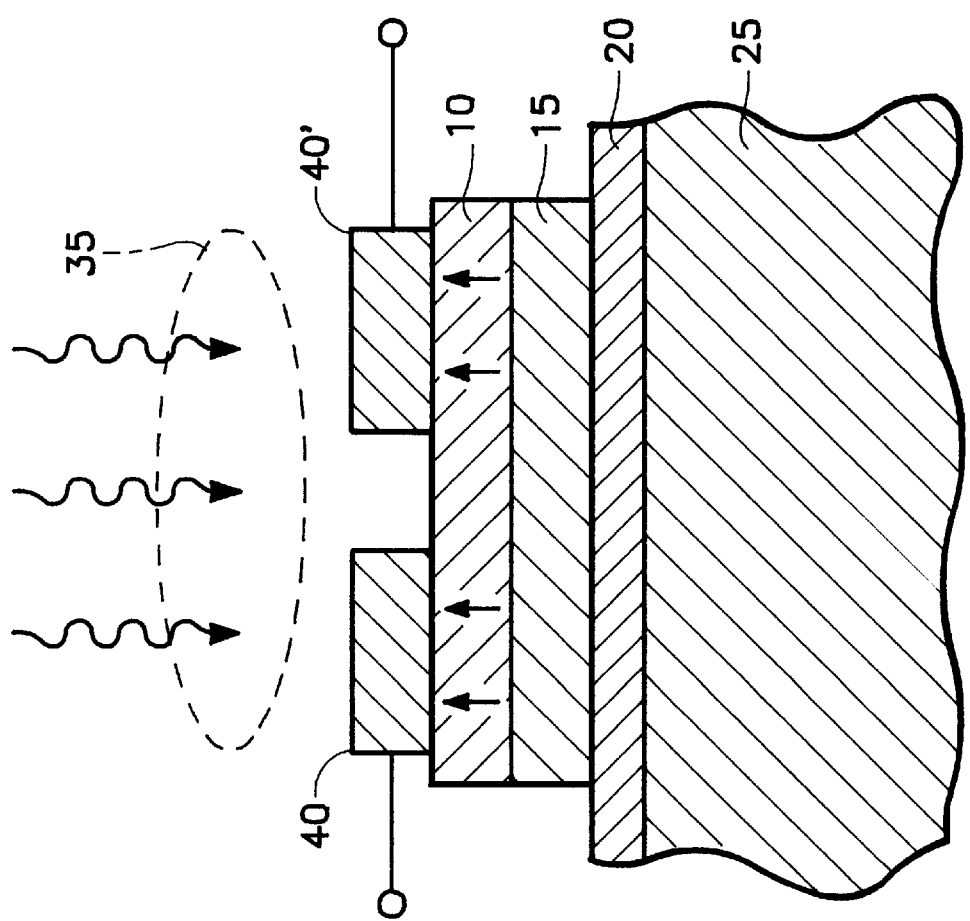
FIG. 15 is a diagram of a ferroelectric optical computing device constituting two devices of the embodiment of FIG. 2 sharing a common bottom electrode, a common ferroelectric crystal layer and separate top electrodes.

Referring again to the embodiment of FIG. 2, it was earlier reported by one of the inventors herein that such a device may exhibit a unipolar response (Thakoor, "High speed optoelectronic response from the edges of lead zirconate or titanate thin film capacitors," *Applied Physics Letters*, Vol. 63 No. 23 pages 3233–3235, Dec. 6, 1993). It is felt that such unipolar response characteristics arise from device defects such as an inadvertent rectifying junction in the top electrode. In order to obtain a bipolar response (as illustrated in FIGS. 4A and 4B) from such defective devices, two such devices may be connected in series as shown in FIG. 15, in which both the bottom electrode 15 and the ferroelectric crystal layer 10 are shared in common between the two devices, but each device has its own top electrode 40, 40', each of the two top electrodes 40, 40' constituting one of the two terminals of the device. The two top electrodes 40, 40' are sufficiently small so that the beam 35 illuminates both top electrodes 40, 40' and their edges simultaneously.

While the invention has been described in detail by specific reference to preferred embodiments, it is understood that variations and modifications thereof may be made without departing from the true spirit and scope of the invention.

What is claimed is:

1. An optical computing device responsive to an optical beam having a beam diameter, said optical computing device comprising:

a bottom electrode having a planar surface;

a ferroelectric crystalline thin film layer overlying said planar surface of said bottom electrode, said ferroelectric crystalline thin film layer having two stable polarization states and a principal crystalline axis and being responsive to an electric field having a component along said principal axis by transitioning between said polarization states, said principal axis being generally non-parallel to said planar surface of said bottom electrode; and a top electrode facing a direction of arrival of said optical beam and having a planar surface generally parallel to said bottom electrode overlying said ferroelectric crystalline thin film layer and having a width not exceeding said beam diameter of said optical beam, wherein said width defines first and second peripheral regions on said ferroelectric crystalline thin film layer which bounds the entire width of said top electrode, wherein said first and second peripheral regions of said ferroelectric crystalline thin film layer underlying said top electrode are illuminated by said optical beam;

wherein said peripheral regions are coupled to an optical polarization vector of said optical beam oriented perpendicular to said principal axis to create deviated secondary crystalline axes within said ferroelectric crystalline thin film layer, said deviated secondary crystalline axes being generally non-parallel to said principal axis and located at opposite ends of said ferroelectric crystalline thin film layer to bound said principal axis.

2. The device of claim 1 further comprising conductor means for applying a potential across said top and bottom electrodes having a polarity corresponding to a desired polarization state.

3. The device of claim 1 further comprising conductor means coupled to said top and bottom electrodes for sensing a current responsive to said optical beam, said current having a polarity indicative of the polarization state of said ferroelectric crystalline thin film.

4. The device of claim 1 wherein said optical beam is linearly polarized in a direction parallel to said planar surface of said bottom electrode.

5. The device of claim 1 wherein said optical beam has a wavelength corresponding to a photon energy less than a band gap energy of said ferroelectric crystalline thin film layer.

6. The device of claim 5 wherein said ferroelectric crystalline thin film layer comprises a PZT crystal and said wavelength is on the order of 532 nanometers.

7. The device of claim 1 wherein said ferroelectric layer exhibits a unipolar optical response comprising a current between said top and bottom electrodes responsive to said optical beam has a first polarity whenever said ferroelectric crystalline layer is in one of said two polarization states and comprising virtually no current whenever said ferroelectric crystalline layer is in the other one of said two polarization states.

8. An optical computing hybrid integrated circuit, comprising:

a photoresponsive layer comprising plural rows and columns of photoresponsive cells each responsive to a respective optical beam having a beam diameter, said photoresponsive layer comprising:

a bottom electrode having a planar surface;

a ferroelectric crystalline thin film layer overlying said planar surface of said bottom electrode, said ferroelectric crystalline thin film layer having two stable polarization states and a principal crystalline axis and being responsive to an electric field having a component along said principal axis by transitioning between said polarization states, said principal axis being generally non-parallel to said planar surface of said bottom electrode;

a top electrode facing a direction of arrival of said optical beam and having a planar surface generally parallel to said bottom electrode overlying said ferroelectric crystalline thin film layer and having a width not exceeding said beam diameter of said optical beam, wherein said width defines first and second peripheral regions on said ferroelectric crystalline thin film layer which bounds the entire width of said top electrode, wherein said first and second peripheral regions of said ferroelectric crystalline thin film layer underlying said top electrode are illuminated by said optical beam;

wherein said peripheral regions are coupled to an optical polarization vector of said optical beam oriented perpendicular to said principal axis to create deviated secondary crystalline axes within said ferroelectric crystalline thin film layer, said deviated secondary crystalline axes being generally non-parallel to said principal axis and located at opposite ends of said ferroelectric crystalline thin film layer to bound said principal axis;

row and column address conductors connected to respective ones of said top and bottom electrodes of said photoresponsive layer; and an optical beam source layer overlying said photoresponsive layer and comprising rows and columns of beam source cells facing respective ones of said photoresponsive cells and row and column address conductors connected to respective ones of said beam source cells.

9. A two-cell optical computing device having a bipolar response to an optical beam having a beam diameter, said optical computing device comprising:

a bottom electrode having a planar surface;

a ferroelectric crystalline thin film layer overlying said planar surface of said bottom electrode, said ferroelectric crystalline thin film layer having two stable polarization states and a principal crystalline axis and being responsive to an electric field having a component along said principal axis by transitioning between said polarization states, said principal axis being generally non-parallel to said planar surface of said bottom electrode; and first and second top electrodes facing a direction of arrival of said optical beam and having planar surfaces generally parallel to said bottom electrode overlying said ferroelectric crystalline thin film layer and together spanning a width not exceeding said beam diameter of said optical beam, wherein said width defines first and second peripheral regions on said ferroelectric crystalline thin film layer which bounds the entire width spanned by said top electrodes, wherein said first and second peripheral regions of said ferroelectric crystalline thin film layer underlying said top electrodes are illuminated by said optical beam, and said first and second top electrodes constituting the terminals of said device;

wherein said peripheral regions are coupled to an optical polarization vector of said optical beam oriented perpendicular to said principal axis to create deviated secondary crystalline axes within said ferroelectric crystalline thin film layer, said deviated secondary crystalline axes being generally non-parallel to said principal axis and located at opposite ends of said ferroelectric crystalline thin film layer to bound said principal axis.

10. The device of claim 1 wherein said optical beam has a power density of 2 milliWatts per square micron.

11. The device of claim 8 wherein said optical beam has a power density of 2 milliWatts per square micron.

12. The device of claim 9 wherein said optical beam has a power density of 2 milliWatts per square micron.

* * * * *

UNITED STATES PATENT AND TRADEMARK OFFICE
CERTIFICATE OF CORRECTION

PATENT NO : 6,108,111
DATED : August 22, 2000
INVENTOR(S): Sarita Thakoor and Anilkumar Thakoor It is certified that error appears in the above-identified patent and that said Letters Patent is hereby corrected as shown below:

In column 1, line 4, please insert the following:

-- ORIGIN OF THE INVENTION

The invention described herein was made in the performance of work under a NASA contract, and is subject to the provisions of Public Law 96-517 (35 U.S.C. §202) in which the Contractor has elected to retain title.--

Signed and Sealed this

Twenty-second Day of May, 2001

Attest:

NICHOLAS P. GODICI

Attesting Officer

Acting Director of the United States Patent and Trademark Office